United States Patent [19]
Tran

[11] Patent Number: 5,548,231
[45] Date of Patent: Aug. 20, 1996

[54] SERIAL DIFFERENTIAL PASS GATE LOGIC DESIGN

[75] Inventor: Joseph Tran, Hillsboro, Oreg.

[73] Assignee: TransLogic Technology, Inc., Beaverton, Oreg.

[21] Appl. No.: 458,963

[22] Filed: Jun. 2, 1995

[51] Int. Cl.$^6$ .......................... G01R 19/00; H03K 17/16; H03K 19/12; G11C 7/00
[52] U.S. Cl. ........................ 327/52; 327/55; 327/379; 326/21; 326/23; 326/133; 365/198; 365/207
[58] Field of Search .................... 327/51, 52, 55, 327/57, 210, 213, 214, 219, 291, 379, 391; 326/21, 24, 113, 23; 365/196, 198, 207

[56] References Cited

U.S. PATENT DOCUMENTS

| | | | |
|---|---|---|---|
| 4,912,348 | 3/1990 | Maki et al. | 326/113 |
| 5,040,139 | 8/1991 | Tran | 364/760 |
| 5,055,716 | 10/1991 | El Gamel | 326/42 |
| 5,162,666 | 11/1992 | Tran | 326/21 |
| 5,200,907 | 4/1993 | Tran | 326/113 |
| 5,343,428 | 8/1994 | Pilo et al. | 327/51 |
| 5,345,121 | 9/1994 | Itoh | 327/51 |

OTHER PUBLICATIONS

ISSCC '84, "Session 1: Custom and Semi–Custom Design Techniques", by Lawrence G. Heller et al.
"A 3.8–ns CMOS 16×16–b Multiplier Using Complementary Pass–Transistor Logic" by K. Yano et al., IEEE Journal of Solid–State Circuits, vol. 25, No. 2, Apr. 1990, pp. 388–395.
"Mixed–Voltage Design Challenges", by John Harrington, ASIC & EDA, Nov. 1993, pp. 36–40.
"Principles of CMOS VLSI Design: A Systems Perspective", by Neil West and Kamran Eshraghian, §5.2.8.
"Formal Design Procedures for Pass Transistor Switching Circuits", by Damu Radhakrishnan et al., IEEE Journal of Solid–State Circuits, vol. SC–20, No. 2, Apr. 1985, pp. 531–536.
"A Placement Algorithm for the Optimal Synthesized Design of Complex MOS Gates", by Yvan Serrat, ISCAS 1989, pp. 909–912.

Primary Examiner—David C. Nelms
Assistant Examiner—Trong Phan
Attorney, Agent, or Firm—Klarquist Sparkman Campbell Leigh & Whinston, LLP

[57] ABSTRACT

A serial differential cell includes complementary positive and negative pass gate networks coupled to a differential amplifier, which produces a valid logic output. The complementary pass gate networks can include one or more pass gate stages coupled in series. In a serial differential multiplexer, a stage includes first and second inputs, and a select input for controlling which input is passed to an output of the stage. For multiple stages, the output of a first stage is coupled to one of the inputs of a next stage. A number of stages can be coupled together in series to form networks, with a differential amplifier coupled between positive and negative networks where necessary to provide a valid logic output.

19 Claims, 3 Drawing Sheets

SERIAL DIFFERENTIAL PASS GATE LOGIC DESIGN

FIELD OF THE INVENTION

The invention generally relates to logic design, and more specifically relates to an improved pass gate logic design.

BACKGROUND OF THE INVENTION

Two important objectives in the design and fabrication of logic circuits are to increase switching speed and reduce power dissipation. These objectives can be achieved through improved fabrication processes as well as through superior circuit designs. The development of a new fabrication process is extremely costly in terms of both time and expense. As a result, significant improvements in process technology come about rather slowly. In the interim, improvements in performance and power consumption are more likely to be achieved by modifying existing designs or developing new logic circuit designs.

One approach to decrease power dissipation in a logic circuit is to "recharacterize" an existing circuit to operate at a lower voltage, thereby reducing its power consumption. "Recharacterization" refers to taking an existing circuit and modifying it so that it operates at another voltage. There is a great demand in the semiconductor industry to recharacterize existing designs so that they operate effectively at lower voltages. If an existing design can be recharacterized without sacrificing performance, it can eliminate costly changes to the fabrication process or engineering time in redesigning the circuit. Unfortunately, present attempts to recharacterize existing circuits have failed because they have not produced the desired performance.

There is always a need for logic designs that reduce power consumption without sacrificing performance, but one type of design where the problem is particularly acute is pass gate logic. Pass gate logic to logic circuits where logical functions are implemented using a network of pass gates coupled in series. When complex logic functions are implemented using pass gate logic, there are often performance problems caused by the threshold voltage drops across pass gates in the design. As a result of the threshold voltage drop, the output of a pass gate may not be a valid logic signal. This problem is even worse for recharacterized circuits.

The easiest way to explain pass gate logic design and highlight the problems associated with it is through an example. FIG. 1 is simple schematic diagram of a CMOS inverter. The input voltage 20 to a typical gate such as the inverter in FIG. 1 is considered a valid logic signal if it is within 20 percent of the supply voltage 22. For 5 volt circuit designs, an input voltage between 4 and 5 volts is a valid logic high, while an input voltage between 1 and 0 volt is a valid logic low. For 3 volt designs, an input voltage between 2.4 and 3 volts is a valid logic high, while an input voltage between 0.6 and 0 volt is a valid logic low. When an input of a logic gate has a valid logic signal, then the output of that gate will have a minimum static leakage current.

Pass gates present a problem because the voltage drop across the pass gate makes it difficult to establish a valid logic signal. The problem arises when a pass gate, connected to the input of the logic gate, cannot produce a valid logic signal at the input of the logic gate. For example, if the input to the inverter in FIG. 1 is connected to an N-channel pass gate 24 as shown in FIG. 2, then the voltage at the input of the inverter can only be as high as the supply voltage less a threshold voltage drop across the N-channel pass gate 24. Given that a threshold voltage for a typical N-channel pass gate is 1 volt for a 5 volt or recharacterized 3 volt circuit, the input voltage of the inverter cannot exceed 4 volts and 2 volts, respectively. These input voltages are not valid logic signals. To turn off the P-channel transistor 26, the voltage at the input 20 to the inverter has to be above 4 volts for a 5 volt process and 2.4 volts for a recharacterized 3 volt process. There is a severe static leakage current at the output (Q) of the inverter because the input voltage is insufficient to turn the P-channel transistor 26 off while the N-channel transistor 28 is on.

There are a number of proposed solutions to this problem, but they do not solve the problem without sacrificing performance. One potential solution is illustrated in FIG. 3 and described in Section 5.2.8 in "Principles of CMOS VLSI Design: A Systems Perspective" by Neil West and Kamran Eshraghian. This circuit presents a problem because it is a pass gate network 30 consisting of many N-channel transistors connected in series. Each pass gate has an associated threshold voltage drop as described above in connection with FIG. 2. As such, the output (F(A,B)) may not produce a valid logic signal, especially for a recharacterized circuit.

To help solve the problem, a pull-up transistor 32 is connected to the pass gate as shown in FIG. 3. If the pull-up transistor 32 is small, then the pass gate network has a better pull-down transition time. However, a small pull-up transistor severely degrades the pull-up transition time. On the other hand, if the pull-up transistor 32 is larger, then the pass gate network has a better pull-up transition time but a severely degraded pull-down transition time.

The pass gate design illustrated in FIG. 4 and described in "A 3.8-ns CMOS 16×16-b Multiplier Using Complementary Pass-Transistor Logic" by K. Yano, T. Yamanaka, T. Nishida, M. Saito, K. Shimohigashi, and A. Shimizu, presents an alternative approach. FIG. 4 illustrates a complementary pass gate circuit including complementary gate inputs 34, complementary drain inputs 36, an nMOS pass-transistor logic network 38, CMOS output inverters 40, 42, and a pair of pull-up transistors 44, 46. This pass gate circuit has the same drawbacks as discussed above. The switching speed of this circuit design decreases as additional pass gates are added in series. The capacitance increases with the addition of more pass gates, decreasing the speed of the circuit.

The problem posed by these pass gate circuits becomes even worse for the 3 volt recharacterized process. Even with the pull-up transistors, the output of the pass gate network can only reach 2 volts in a 3 volt recharacterized circuit. This output voltage is well below the minimum valid logic high voltage (2.4 volt for the 3 volt circuit). Therefore, the pull-up transistor requires more time to pull-up, and thus slows down the speed of the circuit.

U.S. Pat. No. 5,162,666, entitled "Transmission Gate Series Multiplexer" provides another alternative circuit design. The transmission gate multiplexer described in this patent has reduced capacitance at the output and the selection lines of the multiplexer. It therefore provides improved switching speed relative to the other designs discussed above. While a pass gate logic circuit designed according to this patent performs well when fabricated according to a 5 volt process and a 3 volt process, the pass gate logic circuit does not achieve acceptable performance when recharacterized for 3 volt operation. The 3 volt recharacterized circuit does not perform well because the threshold voltage drop across a pass gate prevents the pass gate from producing a valid logic signal at its output.

As is apparent from these prior art designs, there is a need for a pass gate logic cell design that provides improved performance, even as the number of pass gates increases. Since both 5 volt and 3 volt operation are in demand, the improved pass gate logic cell must also be able to operate well at 5 volts as well as at a recharacterized 3 volts.

SUMMARY OF THE INVENTION

To address the drawbacks and limitations of existing logic designs, the invention provides an improved differential cell design. One embodiment of the invention is a serial differential multiplexer having complementary positive and negative pass gate networks coupled to a differential amplifier. The networks include one or more pass gate stages, where the stages include a first and second input and a select node for passing a selected input to an output node. To increase the number of inputs for the multiplexer, additional stages are added in series such that the output of a first stage is coupled to one of the inputs of the next stage. The outputs of the positive and negative pass gate networks are coupled to the differential amplifier, which produces a valid logic signal, and its complement, at complementary outputs.

The differential multiplexer can also be expanded beyond the output of a first differential amplifier. Additional complementary stages can be connected to the output of the first differential amplifier in a similar manner to the first positive and negative pass gate networks. In this approach, the size of each positive and negative pass gate network depends on the number of complementary stages that can be coupled in series without the need for a differential amplifier to restore the logic signal.

A logic circuit designed according to the invention provides improved performance and reduced power dissipation. The differential amplifier is connected to complementary pass gate networks to optimize switching speed of the logic circuit. The logic circuit provides excellent performance when operated at 5 volts, and can even perform well when recharacterized for 3 volt operation. As a result, the design results in substantial savings because a 5 volt circuit does not have to be re-designed for 3 volt operation.

Further advantages and features of the invention will become apparent with reference to the following detailed description of several embodiments and accompanying drawings.

DETAILED DESCRIPTION

Figure 5:
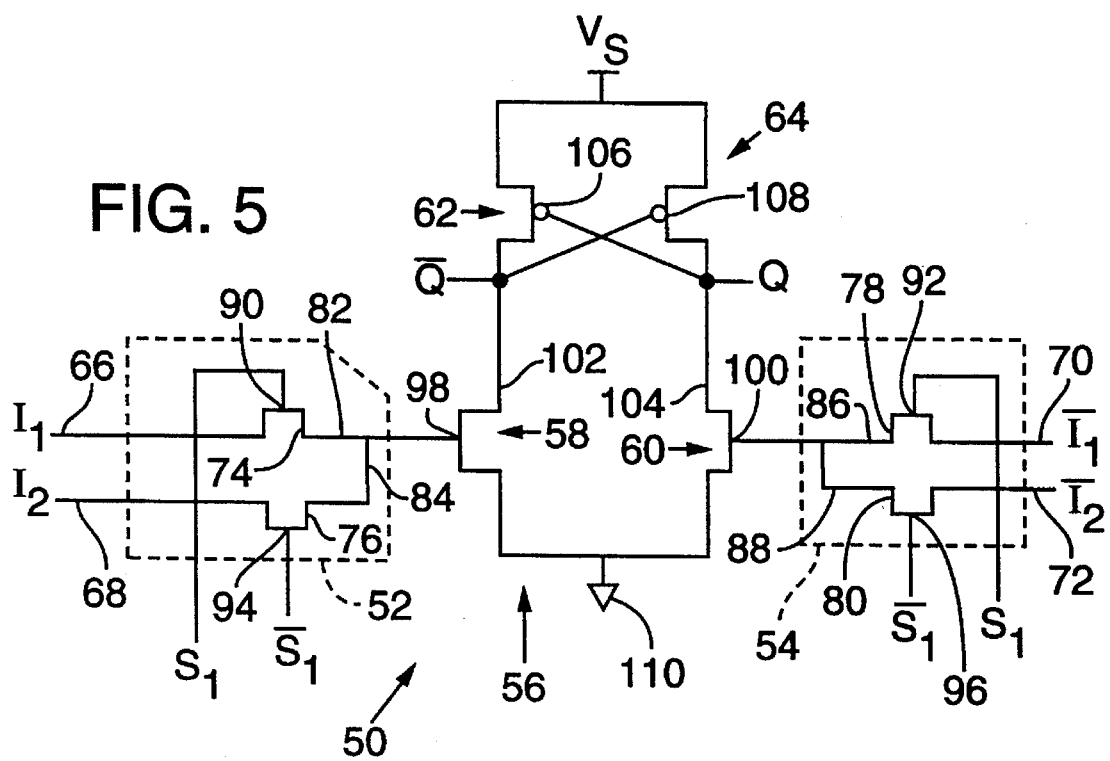
FIG. 5 is a schematic diagram of a differential multiplexer cell.

FIG. 5 depicts a differential multiplexer cell ("differential cell") designed according to the invention. The differential cell 50 includes positive and negative pass gate networks 52, 54 and a differential amplifier 56 coupled between the positive and negative networks. The differential amplifier 56 includes a pair of cross-coupled transistors 58, 60 coupled to the outputs of the networks, and a pair of pull-up transistors 62, 64. The positive and negative pass gate networks 52, 54 are complements to each other as shown by the respective inputs for each network. The "complements" refers to how each pass gate in the positive network has a corresponding pass gate in the negative network. Input signals applied to the positive network are inverted and then applied to corresponding input nodes in the negative network.

The differential cell 50 in FIG. 5 is a 2:1 multiplexer circuit. Input signals $I_1$ and $I_2$, and their complements $\bar{I}_1$ and $\bar{I}_2$, are applied to the inputs nodes 66, 68, 70, 72 of the multiplexer. Select signal $S_1$ and its complement $\bar{S}_1$, control which input signal passes to the output of the multiplexer, Q.

The positive and negative pass gate networks 52, 54 in FIG. 5 each include a single stage of pass gates. As will become apparent from the description of alternative multiplexer embodiments, the number of pass gate stages can vary to create multiplexers of varying sizes (e.g. 2:1, 3:1, etc.). This particular embodiment has a single stage, comprising one pair of pass gates (74 and 76, 78 and 80) in each network. Additional pass gate stages can be added in series as will be described below. The differential amplifier 56 restores a signal at the output of a pass gate stage to a valid logic signal. The description of the 2:1 multiplexer cell will help simplify the description of the structure and operation of more complicated embodiments.

The input signals $I_1$ and $I_2$ are applied to the input nodes 66, 68 of the pass gates as shown. The output nodes 82, 84, 86, 88 of a pass gate pair in a stage are coupled together. Only one of the two input signals of a pass gate stage is passed to the output of the pass gate stage. To control which input signal passes to the output of the stage, the selection signals $S_1$ and $\bar{S}_1$ are applied to the respective gate nodes of the pass gates as shown. At the gate nodes 90, 92 of a first pass gate in a stage, the selection signal $S_1$ is applied. At the gate nodes 94, 96 of the second pass gate in the stage, the complement $\bar{S}_1$ of the selection signal is applied.

The outputs of the positive and negative pass gate networks 52, 54 are applied to the gate nodes 98, 100 of the cross-coupled transistors 58, 60. In this implementation, the cross-coupled transistors are N-channel MOS transistors. The drain node 102, 104 of each of these transistors is cross-coupled to the gates 106, 108 of a P-channel transistors. The P-channel transistors act as pull-up transistors to ensure that the outputs of the multiplexer, located at the drain nodes of the N-channel transistors, are valid logic signals.

The 2:1 multiplexer operates as follows. When the select signal $S_1$ is a logic high signal, the input signal $I_1$ is propagated to the output node 82 of the pass gate stage in the positive network 52. Conversely, when it is a logic low level, the input signal $I_2$ is propagated to the output node 84 of the pass gate stage. At the same time, an inverted input signal is passed to one of the output nodes 86, 88 of the corresponding stage in the negative network 54. The signals passed through the pass gates in each network are applied to the respective gates of the cross-coupled N-channel transistors.

The pull-up transistors ensure that a valid logic signal is passed to the output Q of the multiplexer. When the output of the positive pass gate network 52 is a logic high, the first N-channel transistor 58 turns on. The voltage at the drain node 102 of the first N-channel transistor then becomes approximately zero because of the coupling to ground 110. When a logic low signal is applied to the gate 108 of the second P-channel transistor 60, it turns on and the voltage at the output Q is pulled up to the supply voltage, $V_s$. When the output Q is at a logic high, the first P-channel transistor 62 remains off, which keeps the output of $\overline{Q}$ at approximately ground.

When the output of the positive pass gate network 52 is logic low, the first N-channel transistor 58 is off. Since the output of the negative pass gate network 54 is the complement of the positive network 52, the voltage at the gate node 100 of the second N-channel transistor 60 is a logic high. The voltage at output Q is approximately ground because of the coupling to ground when the second N-channel transistor 60 turns on. When the output Q is at a logic low, the first pull-up transistor 106 turns on and pulls $\overline{Q}$ up to the supply voltage, $V_s$.

This circuit provides excellent performance because the pull-up transistors 62, 64 only have to charge up a single transistor 58, 60. When the number of pass gates increases, the path from the outputs Q and $\overline{Q}$ remains the same. In this case, the path is always a single transistor. Thus, the differential cell is fast even as more pass gate stages are added. In addition, the circuit performs well for a recharacterized design because the differential amplifier 56 restores a valid logic signal.

Figure 1:
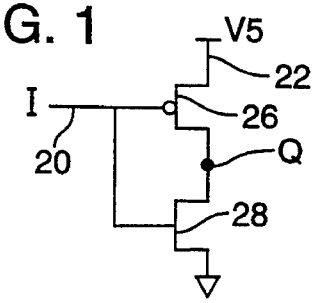
FIG. 1 is a schematic diagram of an inverter used to illustrate problems associated with known circuit designs.
Figure 2:
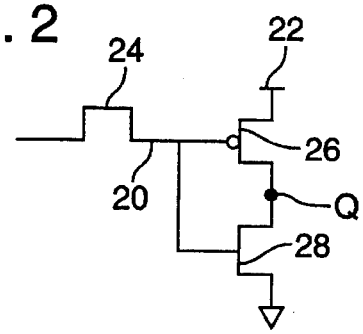
FIG. 2 is a schematic diagram of an inverter with a pass gate coupled at its input to illustrate problems associated with known circuit designs.
Figure 3:
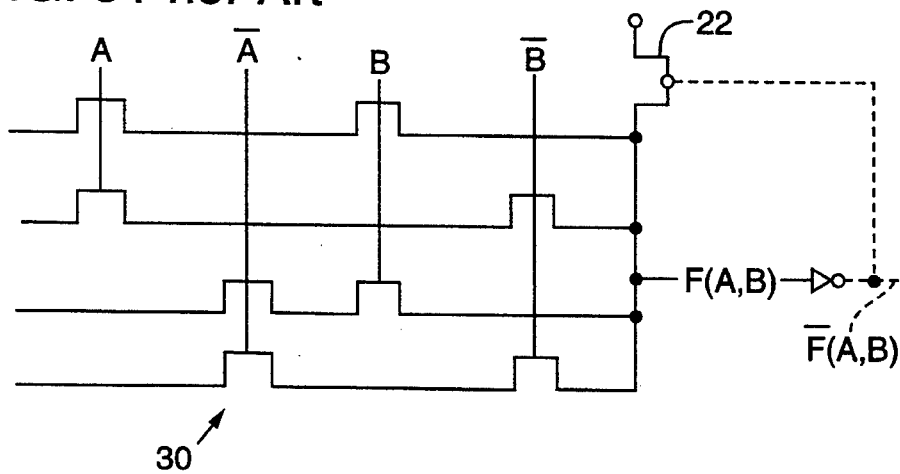
FIG. 3 is a schematic diagram of a known pass gate design.
Figure 6:
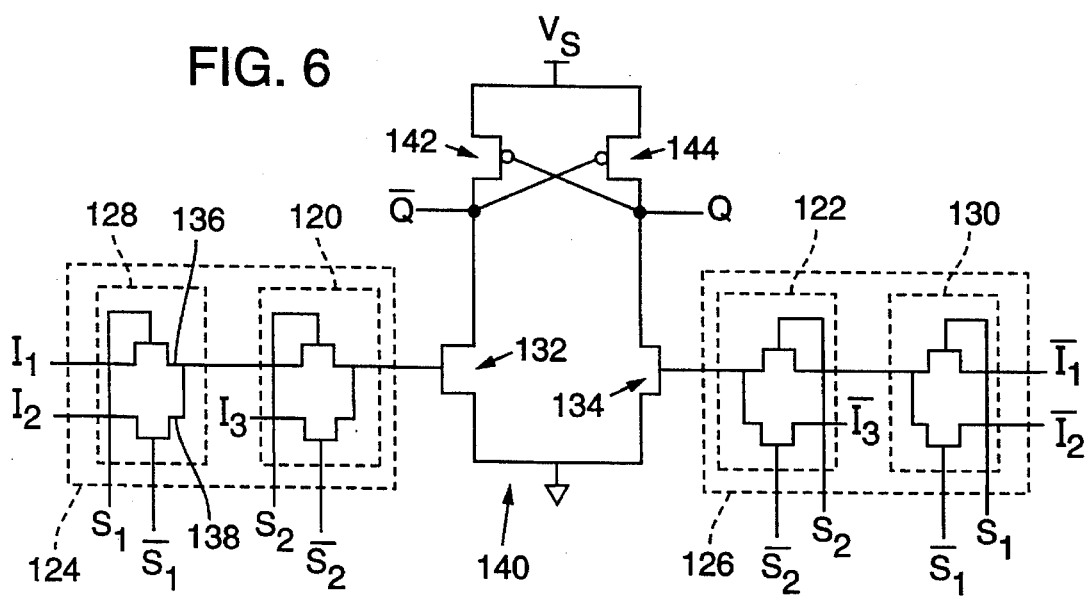
FIG. 6 is a schematic diagram of a 3:1 differential multiplexer.
Figure 4:
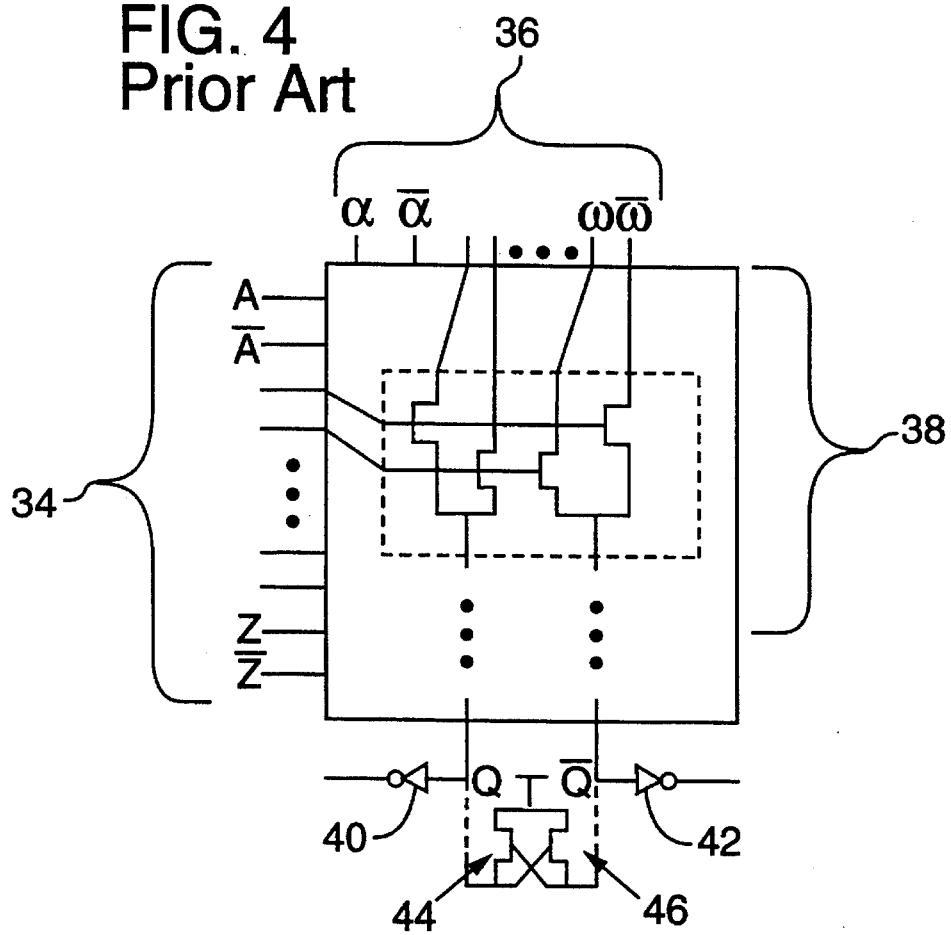
FIG. 4 is a schematic diagram of another known pass gate design.

FIG. 6 is a schematic diagram of a 3:1 differential multiplexer. The structure of the 3:1 multiplexer is similar to the 2:1 multiplexer, except that the 3:1 multiplexer includes an additional stage 120, 122 of pass gates in each pass gate network 124, 126. Each pass gate network 124, 126 includes two stages 120 and 122, 128 and 130, of pass gates coupled in series. The outputs of the second stages 120, 122 in the positive and negative pass gates are coupled to the cross-coupled transistors 132, 134.

Each stage of pass gates has two input signals and a select signal. The first stage has inputs $I_1$ and $I_2$, and its complement has inputs $\overline{I}_1$ and $\overline{I}_2$. The output nodes 136, 138 of the pass gates in each stage are coupled together such that one of the inputs, $I_1$ or $I_2$, and its complement $\overline{I}_1$ or $\overline{I}_2$, are passed to the second stage 120, 122. The output of the first stage is the first input, and $I_3$ is the second input to the second stage. The second stage in the negative network has inverted inputs: $\overline{I}_1$ or $\overline{I}_2$, and $I_3$.

The first and second stages, and their complements, have a select signal. Select signal $S_1$ and its complements $\overline{s}_1$ are applied at the first stage, and select signal $S_2$ and its complement $\overline{s2}$ are applied to the second stage.

The operation of the 3:1 multiplexer is similar to the 2:1 multiplexer described with reference to FIG. 5. When an additional stage is added, such as the second stage in FIG. 6, there is a threshold voltage drop between the inputs of the first stage and the differential amplifier 140. The differential amplifier 140 restores the output of the positive and negative networks to a valid logic signal. As in the 2:1 multiplexer, pull-up transistors 140, 142 only have to charge up transistors 132, 134, even though the 3:1 multiplexer has an additional pass gate stage.

The number of stages coupled in series in the positive and negative networks can be extended, subject to the need to restore the output of a stage to a valid logic level. Where necessary, a differential amplifier can be inserted between the outputs of positive and negative networks to ensure that the output is a valid logic level.

Figure 7:
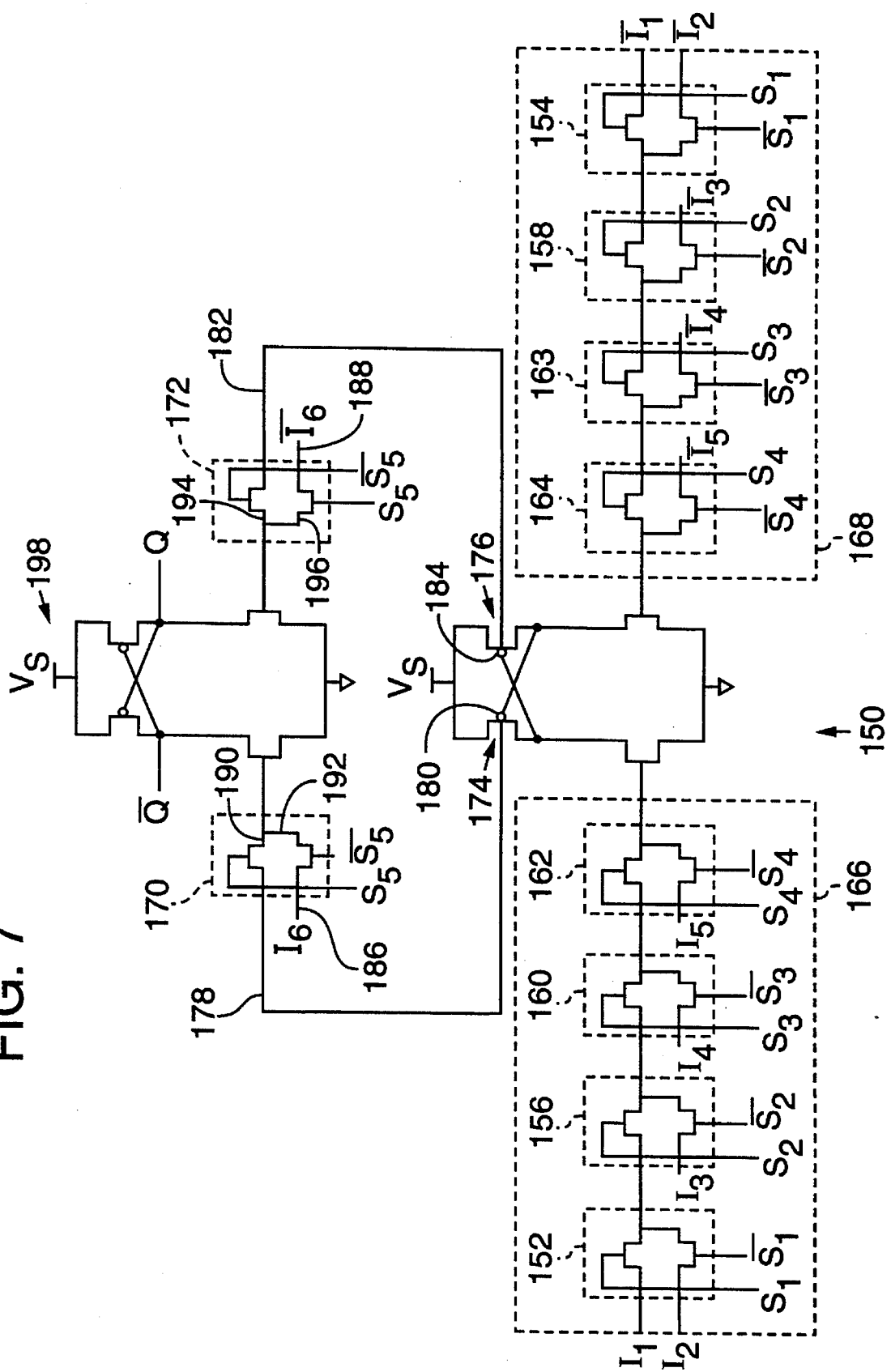
FIG. 7 is a schematic diagram of a 6:1 differential multiplexer.

FIG. 7 is a schematic diagram of a 6:1 multiplexer. This schematic illustrates how a differential amplifier 150 can be inserted to restore logic signals after four stages 152–164 of pass gates. The 6:1 multiplexer shown in FIG. 7 has two positive and negative pass gate networks (166, 168 and 170, 172. The first positive and negative networks 166, 168 have four complementary stages 152–164 of pass gates. After the fourth stage 162, 164, a differential amplifier 150 is inserted to restore the logic signal at the outputs of the first positive and negative networks 166, 168.

To add additional stages beyond the first four networks, another stage of complementary pass gates 170, is coupled to the pull-up transistors 174, 176 in the first differential amplifier 150. The first input node 178 of the fifth stage is coupled to the gate node 180 of the first pull-up transistor 174, and similarly, the complement input node 182 is coupled to the gate node 184 of the second pull-up transistor 176. A sixth input signal $I_6$, and its complement, are applied to the second input node 186 and its complement 188 in the fifth stage. Like all other stages, the output nodes 190, 192, 194, 196 of the pass gates in the second positive and negative networks 170, 172 are coupled together.

The outputs of the second positive and negative networks are coupled to a second differential amplifier 198. A differential amplifier is coupled between each pair of complementary networks. The signal at the gate 180, 184 of the pull-up transistors in the first differential amplifiers is restored to a valid logic level and passed through to the second positive and negative networks 170, 172. The second differential amplifier 198 restores the output of the second positive and negative networks and produces outputs Q and $\overline{Q}$ at a valid logic level.

In general, a variety of multiplexer cells can be created from complementary pass gate stages. Differential amplifiers can be added between positive and negative pass gate stages where necessary to restore a valid logic signal. An N:1 multiplexer can be created from N−1 stages of complementary pass gate stages. The complementary pass gate stages are connected in series to form positive and negative pass gate networks. If the output of a number of pass gate stages, coupled in series, does not produce a valid logic signal, then a differential amplifier can be added. The complementary pass gate stages coupled on each side of the differential amplifier form a first positive and negative pass gate network. Additional complementary are then added in a second positive and negative pass gate network.

Stages in the N:1 multiplexer each have a pair of pass gates. The first input is provided externally, in the case of the first input signal $I_1$; passed from the output of a previous stage, in the case of stages within a network; or passed from a differential amplifier in the case of junctions between pass gate networks. The latter two cases are actually the same: the first input signal to the next stage is passed from the output of the previous stage. The second input to the next stage is provided external to the cell.

Stages in the N:1 multiplexer are controlled through N−1 select signals and their complements. The gate node of the first pass gate in a stage is coupled to a select signal, while the gate node of the second pass gate in a stage is coupled to this select signal's complement.

Since it is the general case, the N:1 multiplexer operates similarly to the 2:1, 3:1, and 6:1 multiplexers described above. Input signals are applied to the input nodes in the positive network or networks, and complements to these input signals are applied to the corresponding input nodes in the negative network or networks. These input signals are selected based on the select signals, and their complements applied to the positive and negative networks. Selected inputs are passed through to the output.

The outputs of the positive and negative pass networks are applied to a differential amplifier where necessary. There is at least one, however, to produce the output signal Q of the multiplexer. The need for a differential amplifier to restore a valid logic signal varies depending on the switching elements used to implement the multiplexer. If transistors with a very low threshold drop are used, then the number of complementary stages connected in series can be increased. In a typical design using CMOS devices, a amplifier is preferable after four stages. However, the number of stages using CMOS technology can potentially be extended up to 7. It should be understood that the number of pass gates in series, and the number of differential amplifiers can vary without departing from the scope of the invention.

In view of the many possible embodiments to which the principles of my invention may be put, it is emphasized that the detailed embodiments described herein are illustrative only and should not be taken as limiting the scope of my invention. Rather, I claim as my invention all such embodiments as may come within the scope and spirit of the following claims and equivalents thereto.

I claim:

1. A serial differential multiplexer cell comprising:
    a pass gate network including a positive network and a negative network, the positive network having two or more inputs complementary to the negative network, the positive network having an output, and the negative network having an output complementary to the output of the positive network, the positive and negative networks having select nodes for selecting an input in the positive network and the complement of the input in the negative network to pass through to the outputs of the positive and negative networks; and
    a differential amplifier for receiving the outputs from the positive and negative network and producing a valid logic output at an output node of the differential amplifier; wherein the positive and negative networks each comprise at least one pass gate stage including two pass gates.

2. The serial differential cell according to claim 1 wherein the at least one pass gate stage comprises a first and second pass gate, the first and second pass gates each having an input and an output, the outputs of the first and second pass gates coupled together.

3. The serial differential cell according to claim 2 wherein the first and second pass gates each include an N-channel transistor.

4. The serial differential cell according to claim 1 wherein the differential amplifier has a complementary output node, and the serial differential cell further including additional positive and negative networks, the additional positive and negative networks having associated differential amplifiers with complementary output nodes coupled to corresponding outputs of the additional positive and negative networks, a first additional positive and negative network coupled to the output and the complementary output of the differential amplifier, respectively; wherein the additional positive and negative networks each comprise at least one pass gate stage including two pass gates.

5. The serial differential cell according to claim 1 wherein the differential amplifier includes first and second transistors having gate nodes for receiving the outputs of the positive and negative networks, and further includes first and second pull-up transistors coupled in series with the first and second transistors, the first and second pull-up transistors having corresponding first and second gate nodes coupled to the output node and a complementary output node of the differential amplifier.

6. The serial differential cell according to claim 1 wherein the differential amplifier is coupled between a supply voltage node and a ground node, and a single transistor is positioned between the output of the differential amplifier and the ground node.

7. A serial differential multiplexer circuit comprising:
    a positive pass gate network including a pass gate stage, and a negative pass gate network including a complementary pass gate stage, the complementary pass gate stages each including first and second input nodes, an output node, and a select node for selecting an input signal at the first or second input nodes to pass to the output node; and
    a differential amplifier coupled between the output nodes of the positive and negative pass gate networks for receiving the input signals passed to the output nodes and producing a valid logic signal at a first output of the differential amplifier; wherein the positive and negative networks each comprise at least one pass gate stage including two pass gates.

8. A method for selecting one of N input signals where N is greater than 1, in a multiplexer including complementary positive and negative pass gate networks, each network having N−1 pass gate stage or stages, and each of the complementary positive and negative pass gate networks including at least two pass gates, the method comprising:
    in a final pass gate stage in the positive and negative networks, selecting one of two inputs, and a complement of the one of two inputs, to pass as an output signal and a complementary output signal of the positive and negative networks;
    receiving the output signal and the complementary output signals at inputs of a differential amplifier coupled between a supply voltage and ground; and
    producing a valid logic signal and a complement valid logic signal at complementary outputs of the differential amplifier.

9. A serial differential cell comprising:
    a pass gate network including a positive network and a negative network, the positive network having two or more inputs complementary to the negative network, the positive network having an output, and the negative network having an output complementary to the output of the positive network, the positive and negative networks having select nodes for selecting an input in the positive network and the complement of the input in the negative network to pass through to the outputs of the positive and negative networks; and
    a differential amplifier for receiving the outputs from the positive and negative network and producing a valid logic output at an output node of the differential amplifier;
    wherein each of the positive and negative networks comprise more than one pass gate stage coupled in series.

10. The serial differential cell of claim 9 wherein the serial differential cell is a multiplexer for selecting N inputs, and each of the positive and negative networks comprise N−1 pass gate stages coupled in series, the N−1 stages having first and second input nodes, an output node, and a select node for selecting an input signal at the first or second input nodes to pass to the output node.

11. A serial differential cell comprising:
    a pass gate network including a positive network and a negative network, the positive network having inputs complementary to the negative network, the positive network having an output, and the negative network having an output complementary to the output of the positive network, the positive and negative networks having select nodes for selecting an input in the positive network and the complement of the input in the negative network to pass through to the outputs of the positive and negative networks; and a differential amplifier for receiving the outputs from the positive and negative network and producing a valid logic output at an output node of the differential amplifier; and wherein the differential amplifier has the output node and a complementary output node, and the output node and the complementary output node are coupled to an input node and a complementary input node of a second positive and negative pass gate networks, respectively.

12. A serial differential multiplexer circuit comprising:

a positive pass gate network including a pass gate stage, and a negative pass gate network including a complementary pass gate stage, the stages including first and second input nodes, an output node, and a select node for selecting an input signal at the first or second input nodes to pass to the output node; and a differential amplifier coupled between the output nodes of the positive and negative pass gate networks for receiving the input signals passed to the output nodes and producing a valid logic signal at a first output of the differential amplifier; and wherein each of the positive and negative networks have more than one stage.

13. The serial differential multiplexer circuit of claim 12 wherein each of the positive and negative networks have two stages.

14. The serial differential multiplexer circuit of claim 12 wherein each of the positive and negative networks have three stages.

15. The serial differential multiplexer circuit of claim 12 wherein each of the positive and negative networks have four stages.

16. The serial differential multiplexer circuit of claim 12 wherein each of the positive and negative networks have five stages.

17. A method for selecting one of N input signals where N is greater than 1, in a multiplexer including complementary positive and negative pass gate networks, each network having N−1 pass gate stage or stages, the method comprising:

in complementary first pass gate stages, selecting one of two inputs, and a complement of the one of two inputs, to pass as an output signal and a complementary output signal of the complementary first pass gates;

in next complementary pass gate stages, receiving the output signal and the complementary output signal of the first complementary pass gate stages as a first input, and receiving another input signal and a complement of the another input signal as a second input;

selecting one of the first input and the complement to pass as an output signal of the next complementary pass gate stages;

in a final pass gate stage in the positive and negative networks, selecting one of two inputs, and a complement of the one of two inputs, to pass as an output signal and a complementary output signal of the positive and negative networks;

receiving the output signal and the complementary output signals at inputs of a differential amplifier coupled between a supply voltage and ground; and producing a valid logic signal and a complement valid logic signal at complementary outputs of the differential amplifier.

18. The method of claim 17 including the steps of:

applying select signals, or complement select signals, to the N−1 stages in the positive and negative networks to select one of the N inputs to pass as an output signal.

19. The method of claim 17 including the steps of:

applying select signals, or complement select signals, to the N−1 stages coupled in series, each stage comprising a 2:1 multiplexer; and passing selected inputs to inputs of successive stages.

* * * * *

UNITED STATES PATENT AND TRADEMARK OFFICE
CERTIFICATE OF CORRECTION

PATENT NO. : 5,548,231
DATED : August 20, 1996
INVENTOR(S) : Joseph Tran

It is certified that error appears in the above-identified patent and that said Letters Patent is hereby corrected as shown below:

Column 1, line 39, "logic to logic circuits" should read --logic refers to logic circuits--

Column 4, line 8, "The "complements"" should read --The term "complements"--.

Column 5, line 44, "$I_3$." should read -- $\overline{I_3}$ .--.

Column 6, line 9, "170, is" should read --170, 172 is--.

Signed and Sealed this

Twenty-sixth Day of August, 1997

Attest:

BRUCE LEHMAN

Attesting Officer     Commissioner of Patents and Trademarks